Inventor:
ARTHUR I. STOLLER
BY [signature]
Attorney

Inventor:
ARTHUR I. STOLLER
By Glenn H. Bruestle
Attorney

Inventor:
ARTHUR I. STOLLER

By [signature]
Attorney

Inventor:
ARTHUR I. STOLLER

Glenn H. Bruestle

Attorney

Inventor:
ARTHUR I. STOLLER
BY [signature]
Attorney 3,381,369

METHOD OF ELECTRICALLY ISOLATING SEMICONDUCTOR CIRCUIT COMPONENTS

Arthur I. Stoller, Princeton Junction, N.J., assignor to Radio Corporation of America, a corporation of Delaware Filed Feb. 17, 1966, Ser. No. 528,156
6 Claims. (Cl. 29—580)

This invention relates to an improved method of fabricating an assembly which includes an array of electrically isolated semiconductor circuit components. Particularly, this invention relates to an improved method of electrically isolating the individual members of an array of circuit components.

One type of integrated circuit comprises a single body of monocrystalline semiconductor material having a plurality of interconnected circuit components formed therein. This type of circuit is usually referred to as the monolithic type.

In monolithic type integrated circuits isolation is achieved by forming a P-N junction in the semiconductor substrate to surround each of the circuit components. However, this method presents some disadvantages. Firstly, circuits fabricated by this method are limited in operation to frequencies up to about 100 mc. At higher frequencies the parasitic capacitance parameter, resulting from the capacitance between circuit components, becomes so great that the operation of the circuit is severely hampered. Secondly, the breakdown voltage between components is relatively low, that is, approximately 60 v. Thirdly, the leakage currents between adjacent components are a problem.

One prior art method for reducing or eliminating the above stated undesirable characteristics is referred to as the "Handle" process. This process involves (1) forming a plurality of mesas on one major surface of a semiconductor wafer, (2) bonding a handle wafer to said surface, (3) removing the other major surface of the wafer to a depth to separate the mesas from each other, (4) depositing an electrical insulator material between the mesas, and (5) removing the handle wafer, whereby the mesas remain separated from each other by the insulator material. This process may use a temperature in the range of 1200° C.–1250° C. for bonding the handle wafer to the one major surface of the semiconductor wafer. Because of the high temperature requirement, the process tends to prohibit the use of prediffused mesas.

Accordingly, it is an object of this invention to provide an improved method of fabricating an assembly which includes a plurality of electrically isolated components.

Another object of this invention is to provide an improved method of electrically isolating a plurality of prediffused mesas formed within a semiconductor wafer, from each other, such that the mesas have one surface exposed to facilitate electrical connection thereto.

Yet another object of this invention is to provide an improved method of fabricating an assembly which includes a plurality of electrically isolated devices which are accurately registered with respect to one another, such that groups of said devices may be interconnected using a standard interconnection pattern.

Still another object of this invention is to provide an improved method of fabricating an assembly which includes a plurality of isolated regions of semiconductor material suitable for the subsequent fabrication of active and/or passive electrical components.

Briefly, the improved method described herein involves forming a groove in one surface of a semiconductor wafer and providing a hole extending from the groove through the wafer. Insulating material is then deposited in the groove by forcing it through the hole from the side of the wafer opposite the groove. The opposite side of the wafer is then removed (e.g. cut away) to a depth sufficient to reach the groove and thereby isolate those portions of the wafer on opposite sides of the groove. Electrical components may be formed within the isolated portions, e.g. by diffusion techniques, either before or after the isolation thereof.

In the drawings:

FIGURE 1 is a flow chart describing a method of isolating a plurality of device areas and represents one embodiment of this invention.

FIGURES 2(*a*)–2(*e*) are cutaway perspective views of a semiconductor wafer and illustrate the various method steps of FIGURE 1 which are performed on the wafer.

Figure 4:
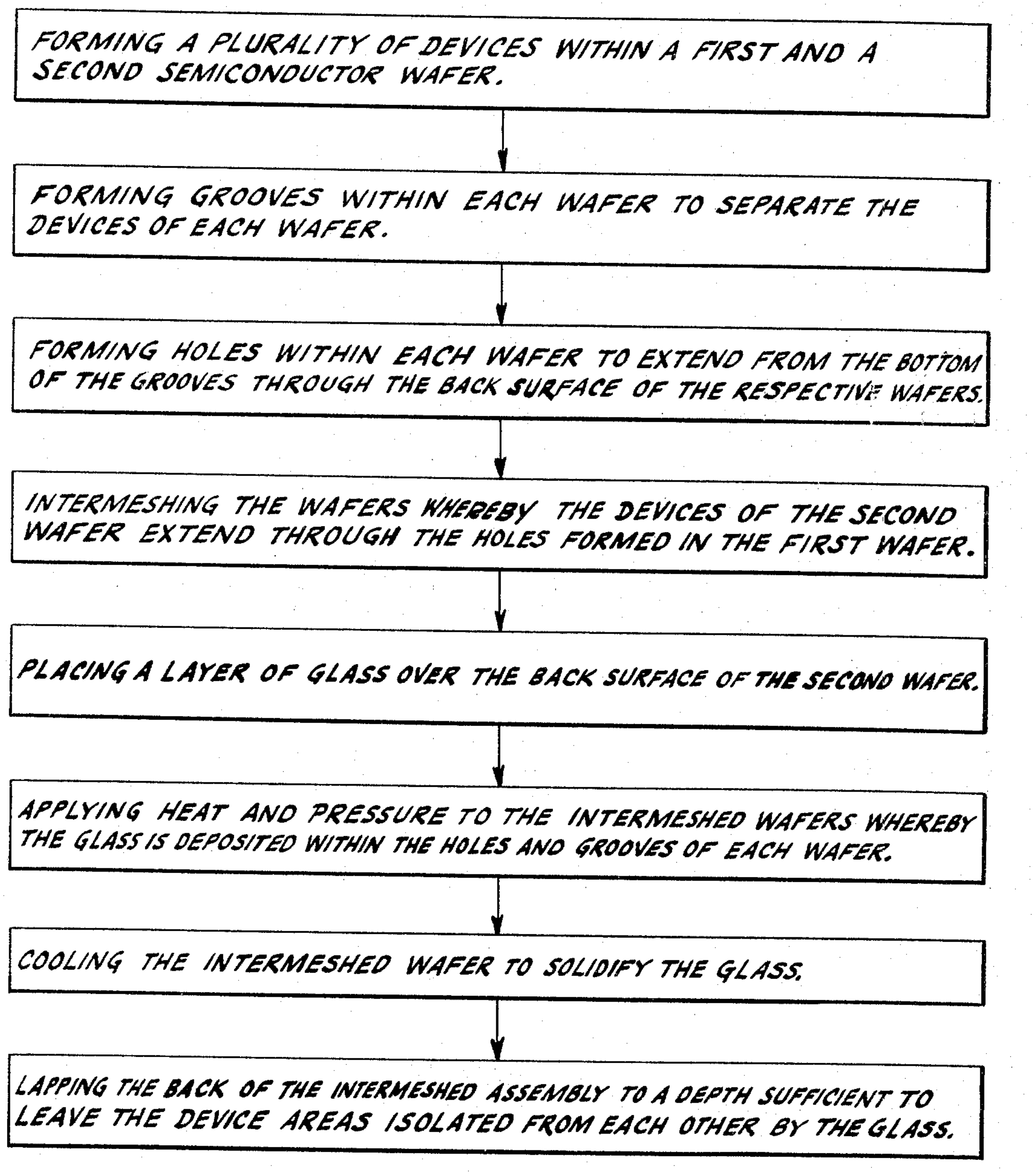
FIGURE 4 is a flow chart describing a method of isolating a plurality of device areas and represents a second embodiment of this invention.
Figure 5:
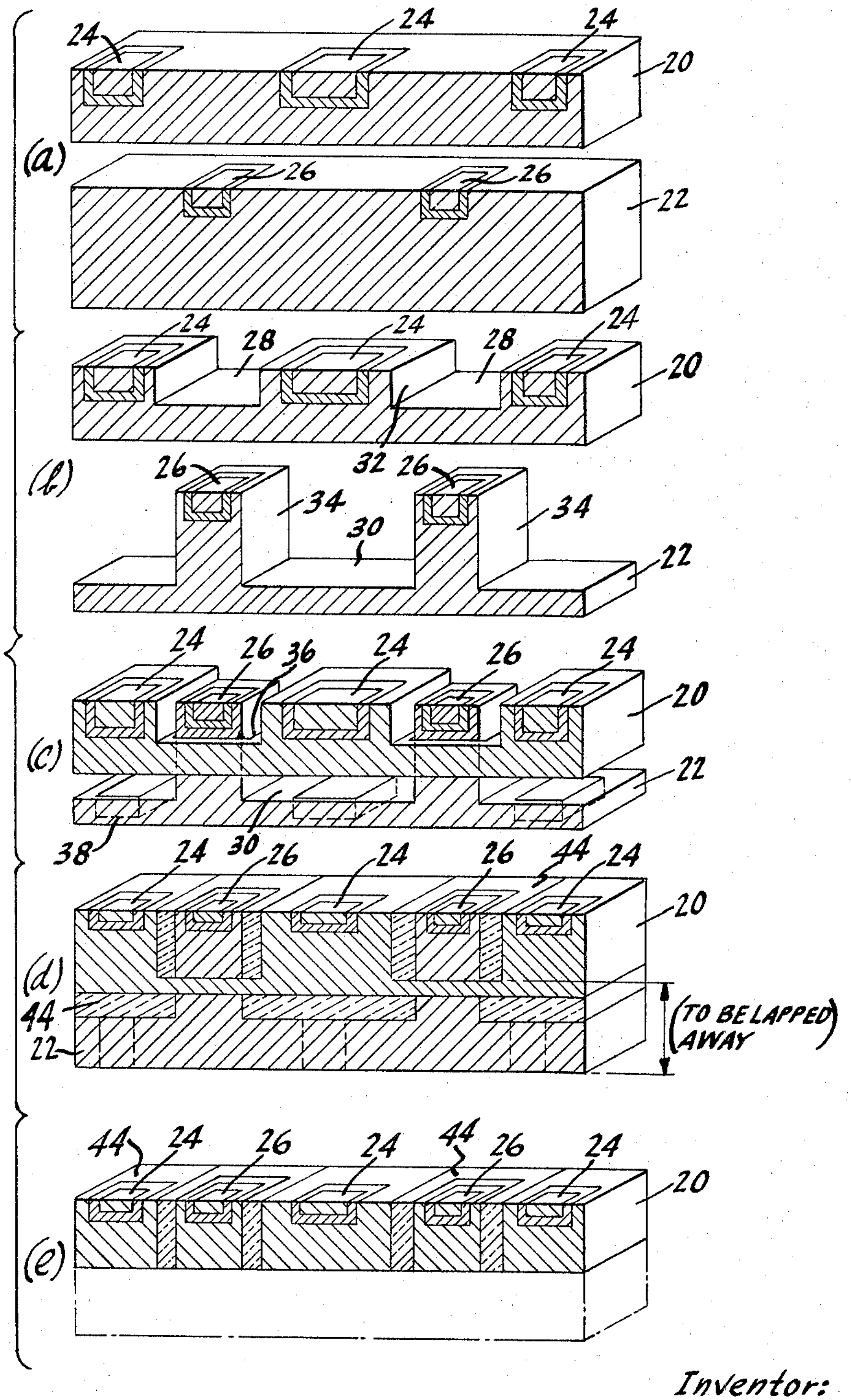

FIGURES 5(*a*)–5(*e*) are cutaway perspective views of two semiconductor wafers and illustrate the various method steps of FIGURE 4 which are performed on the wafers.

Figure 6:
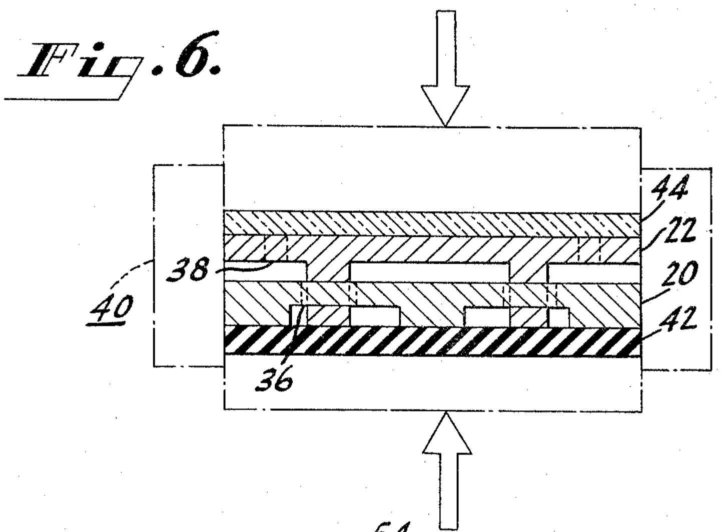

FIGURE 6 is a cross section view of a mold (in phantom) and illustrates the method step of applying heat and pressure to the wafers as described in FIGURE 4.

FIGIURE 7 is a cutaway perspective view of an assembly which is fabricated by altering the method of FIGURE 4, which altered method represents a third embodiment of this invention.

*Example I*

Figure 1:
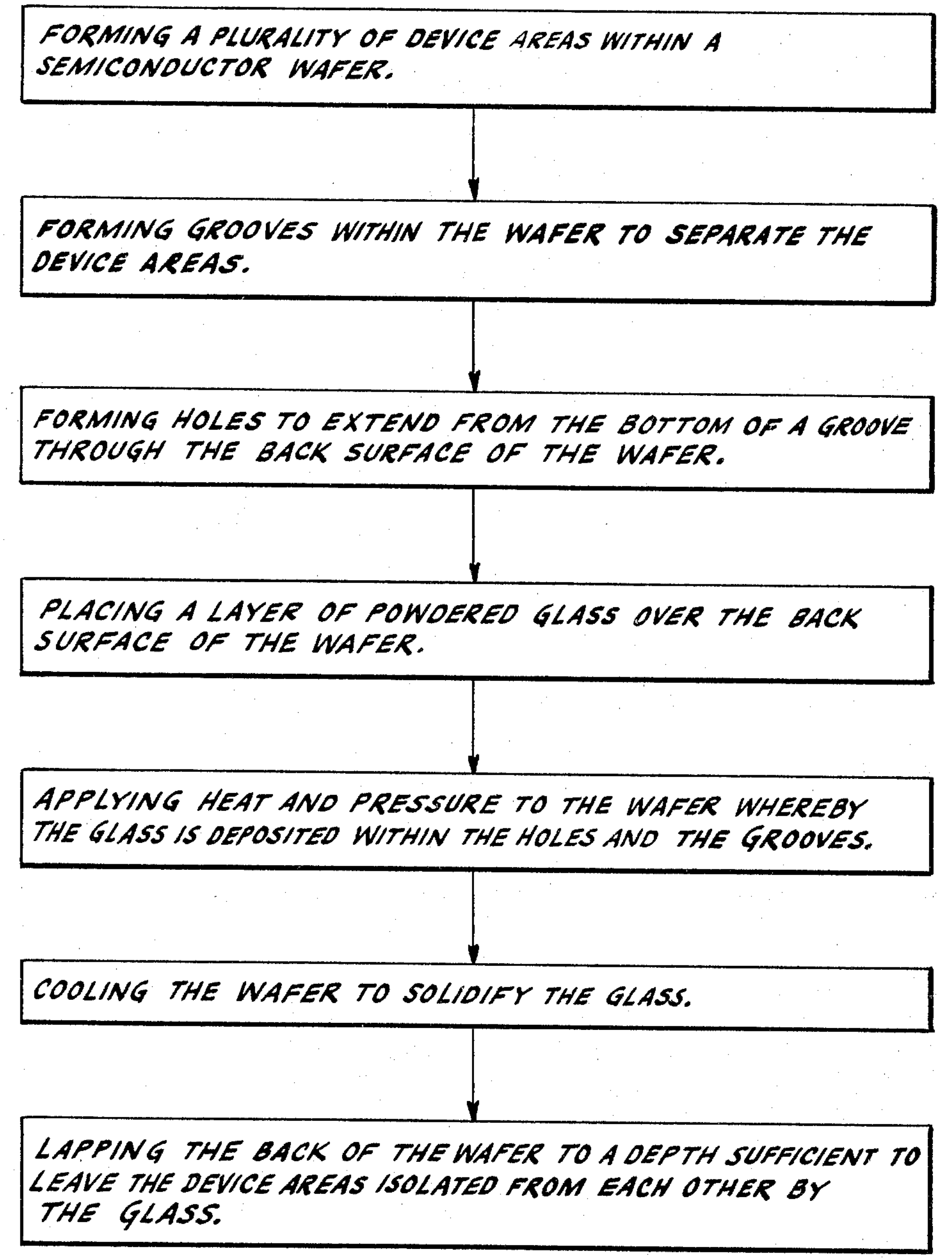
Figure 2:
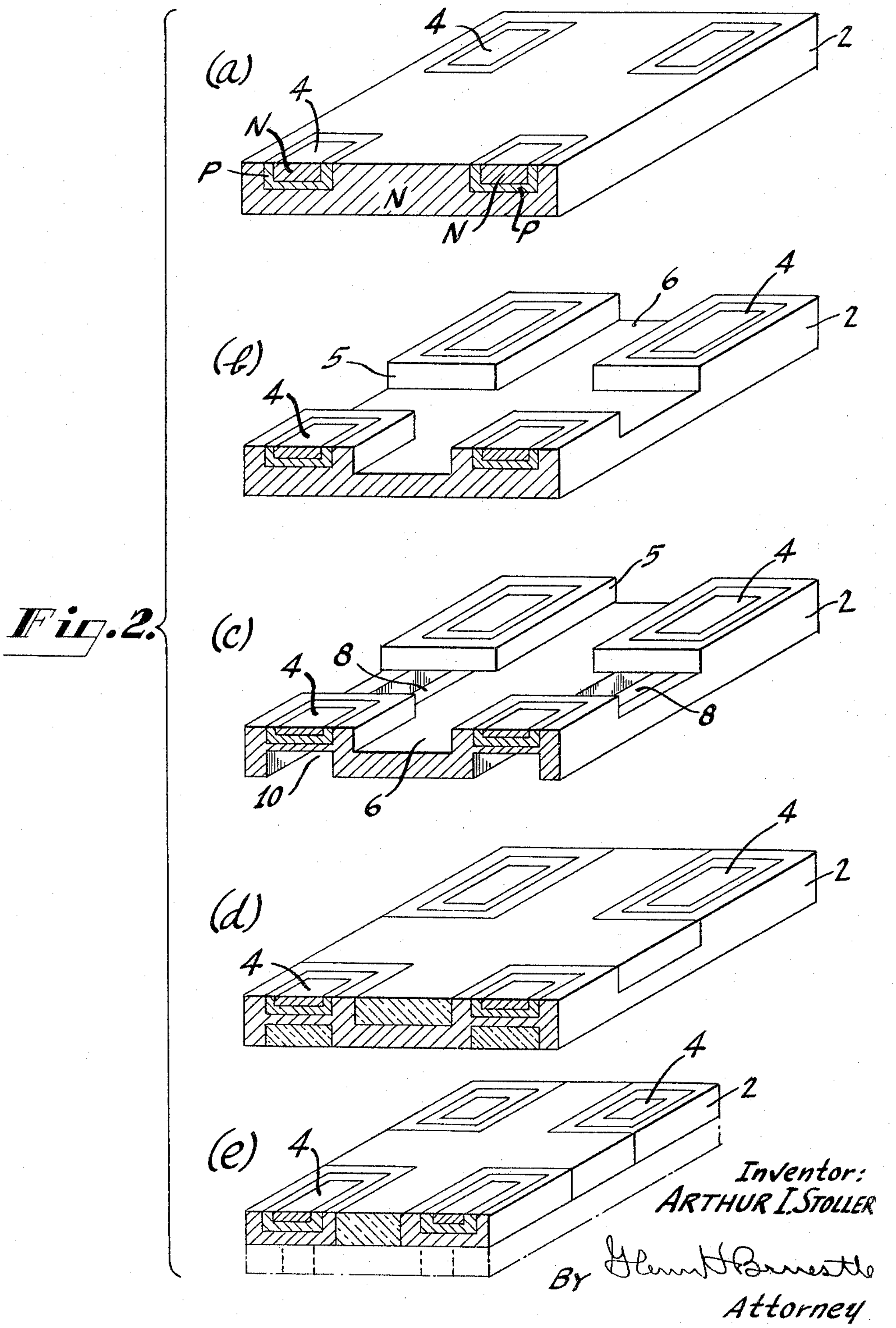

The starting material for the method described in FIGURE 1 is a flat, polished semiconductor wafer 2 (FIGURE 2(*a*)). A plurality of devices 4 are formed within the wafer 2 by any suitable prior art technique as, for example, by diffusing impurities into the wafer to form discrete conductivity type regions therein. Preferably, the devices 4 form a pattern or array, as illustrated in FIGURE 2(*a*).

Next, a plurality of protruding portions 5 each of which includes a device 4 (FIGURE 2(*b*)) are provided by the formation of a plurality of grooves 6 formed within the wafer from the front surface thereof. The grooves 6 may be formed by etching, sawing, ultrasonic cutting, or any other suitable method.

A plurality of holes 8 are then formed in the wafer to extend from the botom of grooves 6 through the remaining thickness of the wafer. The holes may be formed by etching, sawing, ultrasonic cutting, or any other suitable method. In the preferred embodiment of forming the holes, the wafer 2 is turned over and a plurality of grooves 10 are formed within the wafer from the back side thereof. The grooves 10 which extend from the back side of the wafer are not aligned with the grooves 6 which extend from the front side. The grooves 10 are made deep enough so that a hole 8 is formed within the wafer wherever a front groove 6 and a back groove 10 intersect, as illustrated in FIGURE 2(*c*). In this manner, holes which extend through the entire thickness of the wafer are formed at the bottoms of the grooves.

Figure 3:
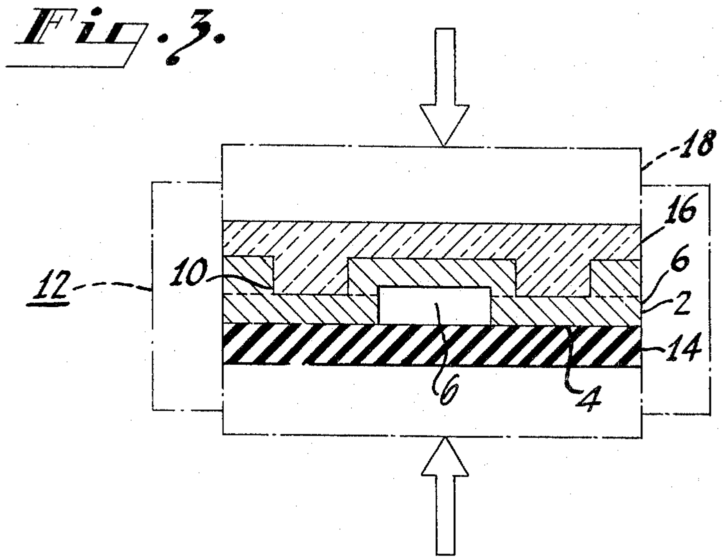
FIGURE 3 is a cross section view of a mold (in phantom) and illustrates the method step of applying heat and pressure to the wafer as described in FIGURE 1.

The wafer of FIGURE 2(*c*) is then placed in a mold 12 as illustrated in phantom in FIGURE 3, whereby the device 4 are disposed against a flat, polished surface of a bottom member 14 composed of a material to which molten glass will not adhere. In the preferred embodiment, the material for member 14 is vitreous carbon. A layer 16 of a material which has a coefficient of expansion that closely matches that of the semiconductor material of wafer 2 is placed over the back surface of the wafer. In the preferred embodiment, the layer 16 is a powdered glass. Two types of glass which have been found satisfactory are sold commercially as Corning #7070 and Corning #1715. In the preferred embodiment Corning #7070 is used. A top platten 18 of the mold is placed over the layer 16. The mold 12 is then placed in an RF heating and pressing apparatus (not shown), and heated to the lowest temperature (900° C.) at which the glass layer 16 flows readily. In selecting a suitable insulator material it is desirable that the softening temperature below enough to prevent damage to the devices 4 which are preformed within the wafer. A softening temperature less than 1100° C. is considered adequate.

Pressure is then applied gradually until about 2500 p.s.i. exerted in the direction of the arrows shown in FIGURE 3. This pressure is maintained for about 15 minutes, during which time the glass of layer 16 melts and is forced through the holes 8 and into the grooves 6. In this manner the grooves 6 and 10 are completely filled with glass. The glass is restrained by the member 14 from flowing over the devices 4. The wafer is then cooled without removing it from the mold to the annealing temperature of the glass approximately 600° C. This temperature is maintained for about 15 minutes to relieve the strains of the glass. The wafer, as illustrated in FIGURE 2(*d*), is then removed from the mold and allowed to cool to room temperature. After cooling to room temperature the back side of wafer 2 is lapped off to a depth (illustrated in phantom in FIGURE 2(*e*) which is at least equal to the depth of grooves 10. The resulting structure is an array of active devices each of which is electrically isolated from the other active devices within the array. The devices within the array are also accurately registered with respect to one another, thereby enabling one to interconnect groups of devices using a standard interconnection pattern.

Alternatively, the devices 4 may be formed within the portion 5 *after* these portions have been isolated from each other by the glass. Although glass is described as the insulator material for electrically isolating the components, other materials may be used, including readily flowable synthetic resins.

Example II

When it is desirable to provide an array of electrically isolated devices whose fabrication on a common wafer would be difficult, e.g. NPN and PNP type devices on the same substrate wafer, the wafer, the method described in Example I is not preferred. For the example given above (NPN and PNP type devices) the difficulty in fabricating the devices on a common wafer is that the entire wafer must be heated although only some of the regions are subjected to diffusion of impurities at any one time. Thus, after one or more of the device areas have been subjected to diffusion steps to forms any base or emitter regions of the transistors, the elevated temperatures to which the entire wafer must be subjected during diffusion steps later performed on other device areas cause those impurities initially introduced to diffuse deeper into the wafer. Consequently, it is difficult to control the impurity concentration profile of those diffused regions which are formed during the earlier processing steps.

The method described in FIGURE 4 provides an array of isolated devices whose fabrication on a common wafer would be difficult. The starting materials for the method of FIGURE 4 are two wafers 20 and 22 illustrated in FIGURE 5(*a*). Devices 24 and 26 are formed within the wafers 20 and 22, respectively, by any suitable prior art technique. Preferably, the devices form a pattern or array. The devices 24 are NPN type and the devices 26 are PNP type.

Next, a plurality of grooves 28 and 30 are formed within the wafers 20 and 22, respectively. The grooves 28 and 30 provide a plurality of protruding portions 32 and 34, respectively, each of which protruding portion includes a device. The grooves may be formed by etching, sawing, ultrasonic cutting, or any other suitable method.

A plurality of holes 36 and 38 are then formed within the wafers 20 and 22, respectively. The holes 36 are formed within wafer 20 so that when the wafer 22 is aligned with wafer 20, such that the top surface of wafer 22 is pressed against the bottom surface of wafer 20, the protruding portions 34 of wafer 22 extend through holes 36 in wafer 20 as illustrated in FIGURE 5(*c*). A hole 36 is made large enough so that a portion 34, when inserted therein, does not completely fill the hole. The holes 38 of the wafer 22 are formed between various protruding portions 34. The holes 36 and 38 may be formed by any suitable method, e.g. etching, sawing, or ultrasonic cutting. In the preferred embodiment, the holes 36 and 38 are formed by ultrasonic cutting.

The wafers 20 and 22 are aligned and then placed in a mold 40, illustrated in phantom in FIGURE 6, whereby the device areas 24 and 26 are against a flat, polished surface of a bottom member 42 composed of a material to which glass will not adhere, e.g. vitreous carbon. The thickness of the wafer 20 and the height of the protruding portion 34 of wafer 22 are such that a space is left between the two wafers when they are disposed within the mold. A layer 44 of a glass having a coefficient of expansion that closely matches that of the wafers 20 and 22 is placed over the back surface of wafer 22. The mold 40 is then placed in an RF heating and pressing apparatus (not shown), and heated to the softening temperature (900° C.) of the glass layer 44. Pressure is applied gradually until about 2500 p.s.i. is exerted in the direction of the arrows shown in FIGURE 6. This pressure is maintained for about 15 minutes, whereby the glass of layer 44 melts and is forced through the holes 28, into the space between the wafers 20 and 22, and through holes 36, and into the spaces between the protruding portions 32 and 34. The glass is restrained by the member 42 from flowing over the device areas 24 and 26. The wafers 20 and 22 are then cooled without removing them from the mold to the annealing temperature of glass (600° C.) This temperature is maintained for about 15 minutes to relieve the strains of the glass. The wafer assembly, as illustrated in FIGURE 5(*d*), is then removed from the mold and allowed to cool to room temperature. After cooling to room temperature, the assembly of FIGURE 5(*d*) is lapped off from the back side. The resulting structure (FIGURE 5(*e*)) is an array of active devices (whose fabrication on a common wafer would be difficult) each of which is electrically isolated from the other devices within the array.

*Example III*

Figure 7:
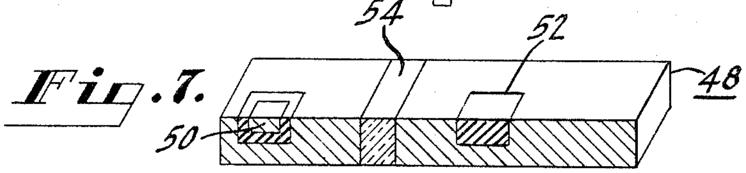

The method of Example II (described in FIGURE 4) may be altered in either of two ways to provide an assembly 48 (FIGURE 7) having a number of active devices and a number of conductive areas in an electrically isolated relationship.

The first way of altering the method of Example II to provide the assembly 48 involves doping the portion adjacent the top surface of each protruding portion 34 of wafer 22 to provide low resistivity areas rather than active devices as described in Example II. By conventional diffusion techniques, these top portions may be doped to provide conductive areas having a resistivity as low as 0.001 ohm-cm. In other respects, the method steps of FIGURE 4 remain unchanged.

The second way of altering the method of Example II to provide the assembly 48 involves a change of materials for wafer 22. Whereas wafer 22 of Example II is composed of a semiconductor material, a corresponding wafer in this example may be composed of a conductive material, e.g. nickel. Consequently, the resulting assembly includes both semiconductor areas and conductive metal areas. In other respects, the method steps of Example II remain unchanged.

The resulting assembly 48 provided by either the first or the second alterations described above is illustrated in FIGURE 7. The assembly 48 comprises a plurality of semiconductor areas 50 and a plurality of conductive areas 52. The areas 50 and 52 are electrically isolated by the material 54 which may be glass.

What is claimed is:

1. A method of fabricating an assembly which includes a plurality of electrically isolated semiconductor portions, comprising:

(a) forming a groove within a front surface of a semiconductor wafer to provide a plurality of protruding portions, (b) forming a hole to extend from the bottom of said groove through the remaining thickness of the wafer, (c) depositing insulating material within said groove by forcing it through said hole from the back side of said wafer, and (d) removing the back portion of the wafer to a depth sufficient to leave said protruding portions isolated from each other by said insulating material.

2. The method as described in claim 1 wherein each of said protruding portions comprises a device area.

3. The method of claim 1 wherein said insulative material is glass and wherein a layer thereof is placed against the back surface of said wafer, is heated to make it flowable, is forced by pressure through said hole to deposit it in said groove, and is then solidified.

4. A method of fabricating an assembly which includes a plurality of electrically isolated semiconductor portions, comprising:

(a) forming grooves which extend from the front surface of a first and a second wafer, respectively, either one or both of which is a semiconductor material, to provide a plurality of protruding portions, (b) forming holes within each of said wafers to extend from the bottom of the grooves through the back surface of the respective wafers, (c) intermeshing the wafers whereby the protruding portions of the second wafer extend through the holes of the first wafer, (d) depositing insulating material into the grooves of both of said wafers by forcing it through the holes of said second wafer from the back side thereof, (e) removing the back of the intermeshed assembly to a depth sufficient to leave said protruding portions isolated from each other by said insulating material.

5. The method of claim 4 wherein said insulative material is glass and wherein a layer thereof is placed against the back surface of said second wafer, is heated to make it flowable, is forced by pressure through the holes of said second wafer to deposit it in said grooves of both of said wafers, and is then solidified.

6. The method as defined in claim 4 wherein one of said wafers is composed of a semiconductor material and the other of said wafers is composed of a conductor material.

References Cited

UNITED STATES PATENTS

| | | | |
|---|---|---|---|
| 3,005,937 | 10/1961 | Wallmark et al. | 29—580 |
| 3,300,832 | 1/1967 | Cave | 29—580 |
| 3,312,879 | 4/1967 | Godejahn | 29—580 |

WILLIAM I. BROOKS, *Primary Examiner.*